United States Patent [19]

Harwood

[11] Patent Number: 4,657,107

[45] Date of Patent: Apr. 14, 1987

[54] LOUDSPEAKER CABINET

[76] Inventor: Warren S. Harwood, 6616 Maplegrove St., Agoura Hills, Calif. 91301

[21] Appl. No.: 830,625

[22] Filed: Feb. 18, 1986

[51] Int. Cl.$^4$ .................................................. H05K 5/00

[52] U.S. Cl. ...................................... 181/144; 181/147

[58] Field of Search ................................ 181/144–147, 181/150, 199, 152; 179/115.5 PS; 381/90

[56] References Cited

U.S. PATENT DOCUMENTS

| | | | |
|---|---|---|---|
| 2,059,929 | 11/1936 | Bobb | 181/146 |
| 2,160,112 | 5/1939 | Van Urk et al. | 179/115.5 PS X |
| 2,955,669 | 10/1960 | Rice | 181/199 |
| 2,994,399 | 8/1961 | Zimmerman et al. | 181/152 |
| 3,637,039 | 1/1972 | Raichel et al. | 181/146 |
| 4,031,318 | 6/1977 | Pitre | 181/146 X |

*Primary Examiner*—Benjamin R. Fuller
*Attorney, Agent, or Firm*—Jack C. Munro

[57] ABSTRACT

A loudspeaker cabinet which has an open top and an open back which is defined by three in number of panels which are connected together. There is a front panel interposed between a pair of side panels with the side panels being angularly disposed relative to the front panel so that the rear edges of the side panels are located closer together than the front edges. Within the front panel there is mounted an array of loudspeakers. The vibrating diaphragm of each of the loudspeakers are located to be substantially in planar alignment with each other.

8 Claims, 3 Drawing Figures

LOUDSPEAKER CABINET

BACKGROUND OF THE INVENTION

The field of this invention relates to sound reproduction equipment and more particularly to the construction of a loudspeaker cabinet so as to achieve a superior reproduction of the sound substantially duplicating the source from whence the sound came.

In the 1920's, discoveries were made which allowed sound waves to be recorded and reproduced by electrical means. Before that time, the record player worked on simple mechanical principles. As the pick-up of the record player traced the record, the mechanical vibrations of the needle were coupled to a flared horn mounted to top of the instrument and this produced the sounds directly. As the theory of electricity became more closely allied to acoustics, the tiny mechanical movements of the needle on the record could be transformed into an electrical signal. This electrical signal could be amplified by an amplifier, but it could not be fed through an acoustic horn. Hence, some means had to be found of converting an electrical signal back into sound waves. This conversion was achieved by the invention of the loudspeaker.

The loudspeaker consists of a light circular diaphragm which is suspended from a metal frame by springy suspensions both around the edge of the diaphragm and near the center of the diaphragm. Mounted forward of the diaphragm is a cone whose function is to direct the produced sound waves from the diaphragm into the ambient. A voice-coil is mounted aft of the diaphragm. When the signal is applied to the voice-coil, a force is exerted and since the voice-coil is rigidly attached to the diaphragm, the diaphragm is caused to move proportionately. The movement of the diaphragm closely follows variations in the electrical signal and sets up sound waves in the air.

The audible frequency range extends from about twenty to twenty thousand cycles per second. It was not long after the first loudspeakers that certain problems arose when radiating such a wide range of frequencies. First, the sound from the rear surface of the diaphragm had to be isolated from that of the front of the diaphragm, otherwise the sounds leaving the two surfaces would cancel each other at low frequencies. Second, sounds are not radiated in all directions, but become concentrated in a narrow beam at high frequencies. This second problem is only more noticeable with large diametered diaphragms so, therefore, it is not a problem when dealing with typical stereo speaker systems which is designed to be utilized within the home. However, to improve the reproduction and efficiency at bass frequencies, a loudspeaker is mounted in a cabinet.

Usually each cabinet will contain more than one speaker. In order to achieve a wide range of sound reproduction, there is utilized a bass type of loudspeaker and a treble type. The base type is frequently referred to as a "woofer" which covers the low or bass range of sound. To cover the high range of sound, there is utilized a smaller in size loudspeaker which is frequently termed a "tweeter".

It has been common in the past to mount these speakers into a single cabinet with the single cabinet containing one or more woofers and one or more tweeters. In order to eliminate the sound cancelling which occurred by the sound produced from the rear of the loudspeakers, it has been common, in the past, to mount the speakers within a cabinet which totally encloses the rear portion of the speakers and also includes a sound deadening material. This type of loudspeaker system is less efficient in that it inherently will require more power from the amplifier because of the significant amount of the sound that is lost in the rear portion of the loudspeakers.

In other cabinet designs, the rear sound waves are arranged to aid those from the front portion of the cabinet after being delayed slightly within the cabinet. The amount of the delay is to be such that the rear portion of the radiations are in phase with the sound waves that are produced from the front portion of the loudspeaker. This "in phase" relationship magnifies the sound waves produced from the front portion of the loudspeaker rather than cancelling the sound wave.

SUMMARY OF THE INVENTION

The structure of the loudspeaker of the present invention is constructed to achieve in essence complete isolation between the front and rear of the diaphragm (as though the cabinet enclosing the rear portion of the loudspeakers were a completely sealed box) with the rear portion of the cabinet being totally and completely open. This openness of the rear portion of the cabinet achieves a greater efficiency of operation as the loudspeakers are not wasting energy compressing air which occurs within the totally sealed type of loudspeaker compartment. Also, the cabinet of the present invention does not allow the back sound waves to be ported or ducted to the front of the cabinet so that phase relationships between the front produced sound waves and the back sound waves can be ignored. Further, by the cabinet of the present invention avoiding parallel side panels or side walls, the cabinet produces a cavity that lacks the resonance that most enclosures encourage. The function of the rear cavity within the cabinet of the present invention, is that of a large low back pressure muffler and to isolate the frontal sound from the rearwardly directed sound. The cavity dissipates the rearwardly directed sound waves allowing the loudspeakers to do their primary task of producing front produced sound waves. A top cover is not needed within the cabinet of the present invention as the sound waves that do manage to exit through the top have an angle and intensity benign to the listener.

The speaker cabinet of the present invention utilizes a front panel within which is mounted an array of loudspeakers. This front panel has an upper edge and a lower edge with the lower edge being adapted to rest on a supporting surface. The array of loudspeakers is oriented more nearer the upper edge than the lower edge so as to position the speakers more nearly at a height level of an ear of an individual located in a sitting position. The array of loudspeakers include both "woofers" and "tweeters". The tweeters are arranged about a common center point as is also the woofers. These center points are to coincide. There is to be a tweeter located between each directly adjacent pair of woofers. The vibrating diaphragms of the woofers are in alignment with each other as is also true with respect with the vibrating diaphragms of the tweeters. Also, the vibrating diaphragms of the tweeters are in alignment with the vibrating diaphragms of the woofers so that the sound that is produced from both the woofers and the tweeters is emitted to be substantially in phase with each other. Each side edge of the front panel is connected to a side panel with there being two in number of the side panels. These side panels are canted or inclined with respect to the front panel so that the rear portion of the side panels are located closer together than the front portion of the side panels. The preferable angle of inclination from perpendicular of each side panel to the front panel is approximately twenty-two degrees. The length of each side panel is substantially equal to the width of the front panel. Each side panel is connected to the front panel so that there is twice as much in length of the side panel extending to the rear portion of the cabinet as opposed to what is extending frontwardly of the cabinet.

DETAILED DESCRIPTION OF THE SHOWN EMBODIMENT

Figure 1:
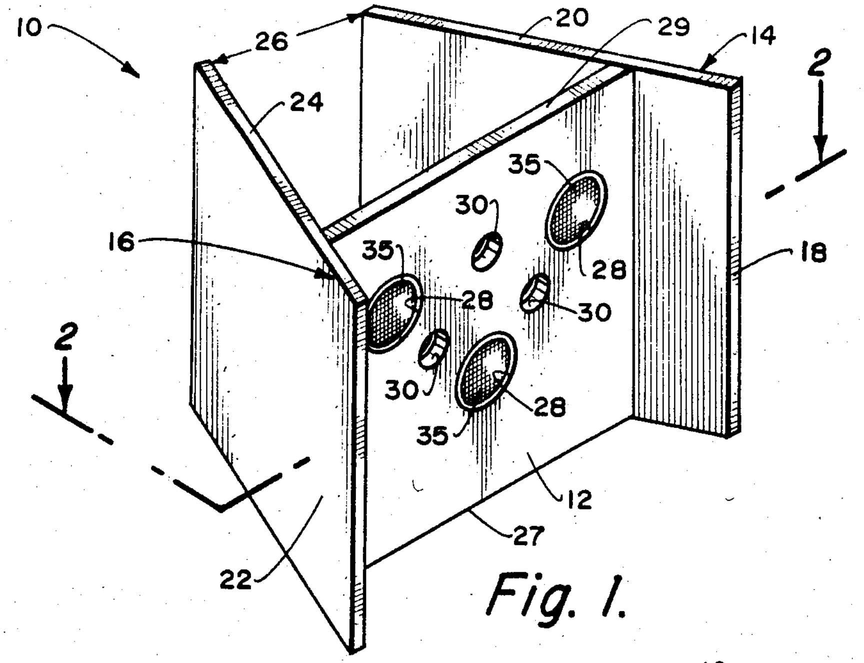
FIG. 1 is an isometric view of the loudspeaker cabinet of the present invention.
Figure 2:
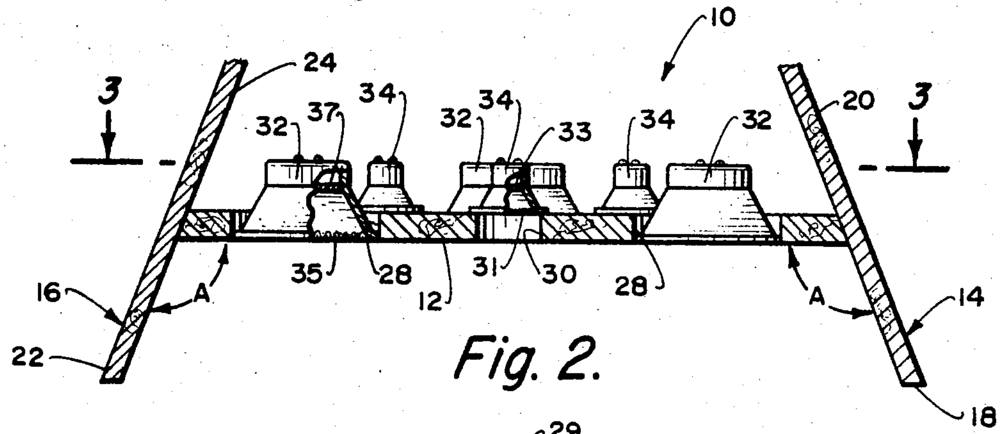
FIG. 2 is a cross-sectional view of the loudspeaker cabinet of the present invention taken along 2—2 of FIG. 1.
Figure 3:
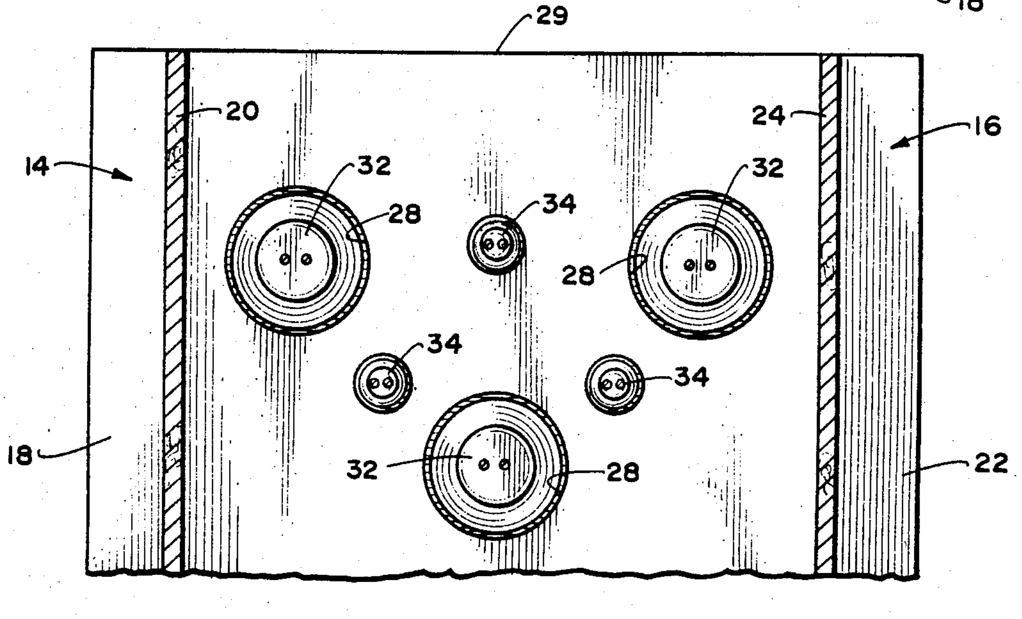
FIG. 3 is a back view, partly in cross-section, of the loudspeaker cabinet of the present invention taken along line 3—3 of FIG. 2.

Referring particularly to the drawing, there is shown the loudspeaker cabinet 10 of this invention which is constructed primarily of a front sheet material panel 12 and side sheet material panels 14 and 16. A typical material of construction of the panels 12, 14 and 16 would be wood. However, any rigid material could be utilized such as plastic or the like. It is to be noted that the height of the panels 12, 14 and 16 are all identical. It is further to be noted that there is no top panel or bottom panel.

The front panel 12 is fixedly secured (by any conventional means) to the side panel 14. This securement is such that it divides the side panel 14 into a front section 18 and a rear section 20. The total length of the side panel 14 will normally be about twenty-four inches if the width of the front panel is twenty-four inches. It has been found to be preferable that the length of the front panel 18 is about one-half of the length of the rear panel 20. In other words, if the length of the front panel 18 that extends forwardly of the front panel 12 is eight inches, then the length of the rear panel 20 that extends rearwardly of the front panel 12 will be approximately sixteen inches.

The side panel 14 is mounted at an inclined angle with respect to the front panel 12. This inclination is such that angle "A" is equal to approximately one hundred twelve degrees.

The side panel 16 is essentially identical to the panel 14 and is mounted onto the left edge of the panel 12 in a manner which is similar to panel 14 being mounted onto the right edge of panel 12. The side panel 16 is divided into a front section 22 and a rear section 24. Again, the length of the side panel 16 will be approximately twenty-four inches with the length of the section 22 being equal to the length of section 18 and the length of section 24 being equal to the length of section 20.

Between the rear edges of the panels 20 and 24 is located a gap 26. The distance of the gap 26 is approximately eleven inches when the aforementioned dimensions are utilized. It is to be noted that the rear sound waves that are emitted from the loudspeakers (to be described) are funneled into the ambient through the gap 26. It is important to have the rear cavity (including gap 26) be large enough to muffle the rearward sound and isolate such from the forward sound (so it won't interface). The size of cavity selected has been proved to be most satisfactory.

Formed within the front panel 12 are a plurality (three in number being shown) of enlarged openings 28. Also formed within the front panel 12 are a plurality (also three in number) of smaller sized openings 30. It is to be noted that the center point of each of the openings 28 lie on a common circle. It is also to be noted that the center point of each of the openings 30 lie on a second common circle. It is preferred to have these center points coincide for obtaining the best focusing of the sound. The diameters of the circles are different. The openings 28 are evenly spaced apart as well as the openings 30.

It is to be noted that there is an opening 30 located in between each pair of directly adjacent openings 28. This particular opening arrangement is found to be particularly desirable to enhance the focusing of the sound emitted from the loudspeaker cabinet 10 of this invention and to further achieve an enlarged "sweet spot" of sound emitted from the loudspeakers which are mounted within the cabinet 10 of this invention.

It has been found to be preferable to locate the holes 28 and 30 closer to the upper edge 29 of the cabinet 10 of this invention than the lower edge 27. The lower edge 27 is adapted to rest on a supporting surface such as the floor of a room. The reason that the holes 28 and 30 are located nearer the upper edge 19 is so that the sound is emitted generally on a horizontal plane which is more even with the ear level of the person receiving the sound. With the height of the front panel 12 being forty-eight inches, the center point of the lowermost opening 28 will be located approximately twenty-five inches from the bottom edge 27. This means that the entire series of openings 28 and 30 are located within the upper half of the front panel 12.

Mounted within each of the openings 28 is a large size loudspeaker 32. Mounted within each of the smaller sized openings 30 is a loudspeaker 34. Each of the speakers 32 are generally what is termed a woofer. Each of the speakers 34 are designed to emit sound in the treble range and are generally termed a tweeter.

Each of the woofers 32 include a vibrating diaphragm 37. Also, the outer open surface of the cone of the speaker 32 is covered by a layer of fabric 35. In a similar manner, the tweeter 34 includes a vibrating diaphragm 33 with its outer open surface of its cone being covered by a layer of fabric 31. Instead of fabric 31 and 35, there may be used a grill covering the entire array of loudspeakers 32 and 34.

The woofers 32 and the tweeters 34 are mounted on the panel 12 so that the diaphragms 33 and 37 all lie substantially on a single vertical plane. The reason for this is so that the sound from the loudspeakers is initiated at the same vertical plane so that the sound waves will in essence be in phase with one another and not tend to cancel one another. In this way, maximum reproduction of the sound is obtained to enhance one's listening pleasure.

The construction of each of the loudspeakers 32 and 34 is deemed to be conventional and forms no specific part of this invention. The center point of the opening 30 which is located nearest the edge 29 is approximately eight and one-half inches from the edge 29. The center point of the pair of openings 28 that are located nearest the edge 29 are approximately eleven and one-half inches from the edge 29.

What is claimed is:

1. A loudspeaker cabinet comprising:

a substantially planar front panel having an upper edge and a lower edge, said lower edge adapted to rest on a supporting surface, said front panel having side edges;

an array of loudspeakers mounted within said front panel, each said loudspeaker having a diaphragm, said diaphragms being located in substantial planar alignment; and:

a first side panel connected to one said side edge, a second side panel connected to the other said side edge, both said first and second said side panels being planar, a portion of said first side panel protruding forwardly of said front panel forming a front section, a portion of said first side panel protruding rearwardly of said front panel forming a first rear section, a portion of said second side panel protruding forwardly of said front panel forming a second front section, a portion of said second side panel protruding rearwardly of said front panel forming a second rear section, both said first side panel and said second side panel oriented at an inclined angle relative to said front panel so said first and second rear sections are located closer together (but spaced apart) than said first and second front sections.

2. The loudspeaker as defined in claim 1 wherein:

the height of said first side panel being equal to the height of the second said panel, the height of said front panel being equal to the height of said first and second said side panels.

3. The loudspeaker cabinet as defined in claim 2 wherein:

a portion of said cabinet in the area of said upper edge being open.

4. The loudspeaker cabinet as defined in claim 3 wherein:

said array being located nearer said upper edge than said lower edge.

5. The loudspeaker cabinet as defined in claim 4 wherein:

said array comprising a plurality of tweeters and a plurality of woofers.

6. The loudspeaker cabinet as defined in claim 5 wherein:

said tweeters being arranged in a first circle having a first center, said woofers being arranged in a second circle having a second center, said first center and said second center coinciding.

7. The loudspeaker cabinet as defined in claim 6 wherein:

there being a said tweeter located between each directly adjacent pair of said woofers.

8. The loudspeaker cabinet as defined in claim 1 wherein:

said angle between said front panel and said front section of said first side panel comprising approximately one hundred twelve degrees, said angle between said front panel and said front section of said second side panel comprising approximately one hundred twelve degrees.

* * * * *